(12) United States Patent
Wood et al.

(10) Patent No.: US 8,592,966 B2
(45) Date of Patent: *Nov. 26, 2013

(54) RF TRANSISTOR PACKAGES WITH INTERNAL STABILITY NETWORK INCLUDING INTRA-CAPACITOR RESISTORS AND METHODS OF FORMING RF TRANSISTOR PACKAGES WITH INTERNAL STABILITY NETWORKS INCLUDING INTRA-CAPACITOR RESISTORS

(75) Inventors: Simon Wood, Raleigh, NC (US); Bradley Millon, Durham, NC (US)

(73) Assignee: Cree, Inc., Durham, NC (US)

( * ) Notice: Subject to any disclaimer, the term of this patent is extended or adjusted under 35 U.S.C. 154(b) by 333 days.

This patent is subject to a terminal disclaimer.

(21) Appl. No.: 12/962,923

(22) Filed: Dec. 8, 2010

(65) Prior Publication Data

US 2011/0074006 A1    Mar. 31, 2011

Related U.S. Application Data

(63) Continuation-in-part of application No. 11/767,172, filed on Jun. 22, 2007, now Pat. No. 8,330,265.

(51) Int. Cl.
*H01L 23/48* (2006.01)

(52) U.S. Cl.
USPC .............. 257/690; 257/691; 438/106; 333/32

(58) Field of Classification Search
USPC .............. 254/690, 691, 724; 438/106; 333/32
See application file for complete search history.

(56) References Cited

U.S. PATENT DOCUMENTS

| 3,969,752 | A |   | 7/1976  | Martin et al. |
|-----------|---|---|---------|---------------|
| 4,193,083 | A |   | 3/1980  | Max |
| 5,942,957 | A | * | 8/1999  | Mohwinkel et al. .......... 333/128 |
| 5,955,926 | A |   | 9/1999  | Uda et al. |
| 6,137,367 | A |   | 10/2000 | Ezzedine et al. |
| 6,384,540 | B1|   | 5/2002  | Porter, Jr. et al. |
| 6,523,150 | B1|   | 2/2003  | Buffet et al. |

(Continued)

FOREIGN PATENT DOCUMENTS

JP         57-91542 A      6/1982
WO     WO 01/56082 A1     8/2001

OTHER PUBLICATIONS

International Search Report and Written Opinion (15 pages) corresponding to International Application No. PCT/US2008/006948; Mailing Date: Dec. 5, 2008.

(Continued)

*Primary Examiner* — Yu-Hsi D Sun
(74) *Attorney, Agent, or Firm* — Myers Bigel Sibley & Sajovec, PA (57) ABSTRACT

A packaged RF transistor device includes an RF transistor die including a plurality of RF transistor cells. Each of the plurality of RF transistor cells includes a control terminal and an output terminal. The RF transistor device further includes an RF input lead, and an input matching network coupled between the RF input lead and the RF transistor die. The input matching network includes a plurality of capacitors having respective input terminals. The input terminals of the capacitors are coupled to the control terminals of respective ones of the RF transistor cells. The input matching network further includes a plurality of resistors coupled respectively between adjacent input terminals of the capacitors.

23 Claims, 9 Drawing Sheets

(56) References Cited

U.S. PATENT DOCUMENTS

| | | |
|---|---|---|
| 6,798,295 B2 | 9/2004 | Pengelly et al. |
| 6,806,106 B2 | 10/2004 | Leighton et al. |
| 6,822,321 B2 | 11/2004 | Crescenzi, Jr. |
| 2002/0013048 A1 | 1/2002 | Macheel et al. |
| 2002/0020894 A1 | 2/2002 | Nishijima |
| 2004/0061214 A1* | 4/2004 | Crescenzi, Jr. ............ 257/691 |
| 2005/0248407 A1 | 11/2005 | Friedrich et al. |
| 2006/0207970 A1 | 9/2006 | Dunn et al. |
| 2008/0094141 A1 | 4/2008 | Gotou et al. |
| 2008/0166986 A1 | 7/2008 | Anand |
| 2008/0315393 A1 | 12/2008 | Farrell et al. |

OTHER PUBLICATIONS

International Search Report Corresponding to International Application No. PCT/US2011/061638; Date of Mailing: Mar. 16, 2012; 15 pages.

International Preliminary Report on Patentability Corresponding to International Application No. PCT/US2011/061638; Date of Mailing: Jun. 20, 2013; 8 Pages.

* cited by examiner

RF TRANSISTOR PACKAGES WITH INTERNAL STABILITY NETWORK INCLUDING INTRA-CAPACITOR RESISTORS AND METHODS OF FORMING RF TRANSISTOR PACKAGES WITH INTERNAL STABILITY NETWORKS INCLUDING INTRA-CAPACITOR RESISTORS

RELATED APPLICATION

The present application is a continuation in part of U.S. application Ser. No. 11/767,172, filed Jun. 22, 2007, now U.S. Pat. No. 8,330,295 entitled "RF TRANSISTOR PACKAGES WITH INTERNAL STABILITY NETWORK AND METHODS OF FORMING RF TRANSISTOR PACKAGES WITH INTERNAL STABILITY NETWORKS," the disclosure of which is hereby incorporated herein by reference in its entirety.

FIELD OF THE INVENTION

This invention relates generally to RF transistors, and more particularly the invention relates to packaged RF transistors having input matching networks, and methods of forming packaged RF transistors having input matching networks.

BACKGROUND

Packaged RF power devices typically include a transistor die mounted on a base and enclosed in a package. An RF input signal is supplied to the transistor through an RF input lead that extends from outside the package to the inside of the package, and an RF output signal is delivered from the device through an RF output lead that extends from inside the package to the outside. An input matching circuit can be included within the package, and can be connected between the RF input lead and an input terminal of the RF transistor. The input matching circuit provides an impedance match at the input of the transistor at the fundamental operating frequency of the transistor.

The RF transistor can include a large periphery transistor die that includes a number of discrete transistor cells on a common substrate and connected in parallel. Input matching can be particularly beneficial for such devices, as it can increase the usable bandwidth of the devices. However, the input matching network typically includes a single capacitor, which can create a lower frequency feedback path between adjacent cells of the large periphery transistor die. This feedback path can reduce the stability of the overall device.

Furthermore, the impedance values of elements of the input matching network must be carefully selected to avoid creating odd mode oscillations. Selection of the impedance values, including selection of appropriate inductances through bond wire lengths, can limit the topology of the matching network.

SUMMARY

A packaged RF transistor device according to some embodiments includes an RF transistor die including a plurality of RF transistor cells. Each of the plurality of RF transistor cells includes a control terminal and an output terminal. The RF transistor device further includes an RF input lead, and an input matching network coupled between the RF input lead and the RF transistor die. The input matching network includes a plurality of capacitors having respective input terminals. The input terminals of the capacitors are coupled to the control terminals of respective ones of the RF transistor cells. The input matching network further includes a plurality of resistors coupled respectively between adjacent input terminals of the capacitors.

The input network may further include first wire bonds between the RF input lead and the input terminals of respective ones of the capacitors, and second wire bonds between the input terminals of respective ones of the capacitors and the control terminals of respective ones of the RF transistor cells.

The input network may further include third wirebonds between the input terminals of the capacitors and respective terminals of the resistors.

The plurality of resistors may be provided as a resistor block between the RF input lead and the RF transistor die, and the resistor block may include a plurality of nodes between respective ones of the resistors. The resistors may be connected in electrical series, and the third wirebonds may be coupled between respective ones of the nodes and the input terminals of the capacitors.

In some embodiments, the input network may include first wire bonds between the RF input lead and terminals of the respective resistors, second wirebonds between the terminals of the resistors and the input terminals of respective ones of the capacitors, and third wire bonds between the input terminals of respective ones of the capacitors and the control terminals of respective ones of the RF transistor cells.

The packaged RF transistor device may further include a base, and the RF transistor die may be mounted on the base between the RF input lead and the RF output lead. The plurality of resistors may be provided as a resistor block on the base between the RF input lead and the RF transistor die.

The plurality of capacitors may be provided as a capacitor block on the base between the resistor block and the RF transistor die.

The resistor block may include a plurality of nodes between respective ones of the resistors. The resistors may be connected in electrical series, and the second wirebonds may be coupled between respective ones of the nodes and the input terminals of the capacitors.

The packaged RF transistor device may further include an RF output lead coupled to the output terminals of respective ones of the RF transistor cells, and a base. The RF transistor die may be mounted on the base between the RF input lead and the RF output lead. The plurality of capacitors may be provided as a capacitor block on the base between the RF input lead and the RF transistor die, and the plurality of resistors may be provided as a resistor block on the base between the RF input lead and the capacitor block. The device may further include a package that houses the RF transistor die and the input matching network, with the RF signal input lead and the RF signal output lead extending from the package.

The capacitor block may include a common ground terminal and a plurality of discrete input terminals, and may further include a common dielectric. In some embodiments, the plurality of capacitors include a plurality of discrete devices.

A packaged RF transistor device according to further embodiments includes an RF transistor die including a plurality of RF transistor cells. Each of the plurality of RF transistor cells includes a control terminal and an output terminal. The packaged RF transistor device further includes an RF input lead and an input matching network coupled between the RF input lead and the RF transistor die. The input matching network includes a split capacitor having a plurality of input terminals. The input terminals of the split capacitor are coupled to the control terminals of respective ones of the RF transistor cells. The input matching network further includes a plurality of resistors coupled respectively between adjacent input terminals of the split capacitor.

The input network may further include first wire bonds between the RF input lead and respective input terminals of the split capacitor, and second wire bonds between the respective input terminals of the split capacitor and the control terminals of respective ones of the RF transistor cells.

The packaged RF transistor device may further include an RF output lead coupled to the output terminals of respective ones of the RF transistor cells, and a package that houses the RF transistor die and the input matching network, with the RF signal input lead and the RF signal output lead extending from the package.

The packaged RF transistor device may further include a base, and the RF transistor die may be mounted on the base between the RF input lead and the RF output lead. The split capacitor may be on the base between the RF input lead and the RF transistor die. The split capacitor may include a common ground terminal and/or a common dielectric.

Some embodiments of the invention provide methods of forming a packaged RF transistor device. The methods include mounting a transistor including a plurality of RF transistor cells on a base. Each of the plurality of RF transistor cells includes a control terminal and an output terminal. The methods further include mounting a plurality of capacitors having respective input terminals on the base, coupling the input terminals of the capacitors to the control terminals of respective ones of the RF transistor cells, coupling a plurality of resistors respectively between adjacent input terminals of the capacitors, and coupling an RF input lead to the input terminals of the capacitors.

The methods may further include forming a package housing on the base, the housing enclosing the transistor and the plurality of capacitors, with the RF input lead extending from the package. Coupling the RF input lead to the input terminals of the capacitors may include forming first wire bonds between the RF input lead and the input terminals of respective ones of the capacitors, and coupling the input terminals of the capacitors to the control terminals of respective ones of the RF transistor cells may include forming second wire bonds between the input terminals of respective ones of the capacitors and the control terminals of respective ones of the RF transistor cells.

The methods may further include coupling an RF output lead to the output terminals of respective ones of the RF transistor cells, and forming a package housing that houses the RF transistor die and the plurality of capacitors, with the RF signal input lead and the RF signal output lead extending from the package.

The methods may further include mounting the RF transistor die on the base between the RF input lead and the RF output lead, and mounting the plurality of capacitors may include mounting a capacitor block on the base between the RF input lead and the RF transistor die. The capacitor block may include a common ground terminal and a plurality of discrete input terminals. The capacitor block may further include a common dielectric. In some embodiments, the plurality of capacitors may include a plurality of discrete devices.

The methods may further include forming third wirebonds between the input terminals of the capacitors and respective terminals of the resistors.

The plurality of resistors may be provided as a resistor block between the RF input lead and the RF transistor die, and the resistor block may include a plurality of nodes between respective ones of the resistors. The resistors may be connected in electrical series, and the third wirebonds may be coupled between respective ones of the nodes and the input terminals of the capacitors.

The input network may further include first wire bonds between the RF input lead and terminals of the respective resistors, second wirebonds between the terminals of the resistors and the input terminals of respective ones of the capacitors, and third wire bonds between the input terminals of respective ones of the capacitors and the control terminals of respective ones of the RF transistor cells.

The methods may further include providing a base, and the RF transistor die may be mounted on the base between the RF input lead and the RF output lead, and the plurality of resistors may be provided as a resistor block on the base between the RF input lead and the RF transistor die.

The plurality of capacitors may be provided as a capacitor block on the base between the resistor block and the RF transistor die.

According to further embodiments of the invention, a packaged RF transistor device includes an RF transistor die including a plurality of RF transistor cells, each of the plurality of RF transistor cells including a control terminal and an output terminal, an RF input lead and an RF output lead, and a matching network coupled between the RF input lead or the RF output lead and the RF transistor die. The matching network includes a plurality of capacitors having respective input terminals. The input terminals of the capacitors are coupled to corresponding control terminals or output terminals of respective ones of the RF transistor cells. The input matching network further includes a plurality of resistors coupled respectively between adjacent input terminals of the capacitors.

In some embodiments, the matching network includes an output matching network coupled between the RF output lead and the RF transistor die, and the input terminals of the capacitors are coupled to corresponding output terminals of respective ones of the RF transistor cells.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Some embodiments of the invention provide packaged RF power transistors. RF power transistors typically include a plurality of transistor cells operating in parallel. Transistors that can be included in packages according to embodiments of the invention can include laterally diffused MOSFETS (LDMOSFET) or other semiconductor devices, such as bipolar devices, MESFET devices, HBTs and HEMT devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

Figure 1:
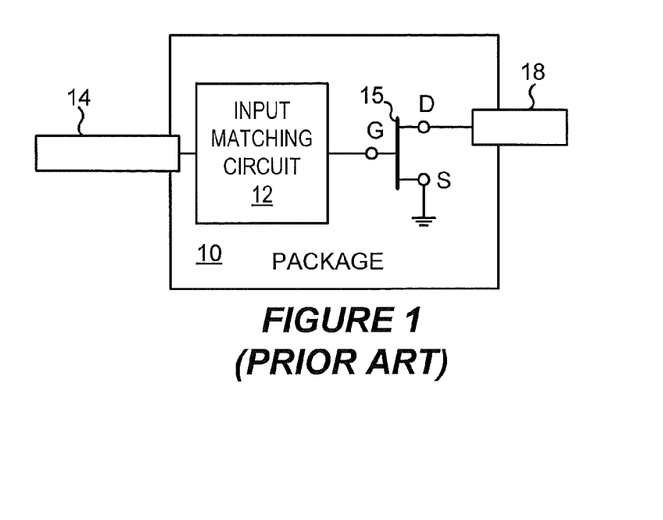
FIG. 1 is a functional block diagram of a conventional RF power transistor.

RF power transistors providing 10 watts or more of power can be packaged as discrete devices, as shown schematically at 10 in FIG. 1. The packaged transistor 15 (which may include a FET or bipolar device, for example) normally includes an input matching circuit 12 connecting an RF input lead 14 to a control electrode of the transistor 15 (e.g., a gate G of a FET or a base of a bipolar transistor). The transistor 15 may be a large periphery RF transistor including a plurality of transistor cells connected in parallel. An RF output lead 18 is connected to an output electrode of the transistor 15 (e.g., the drain D of a FET or the collector or emitter of a bipolar transistor). The RF input lead 14 and the RF output lead 18 extend outside the package 10, as shown in FIG. 1. The source S of the FET 15 may be grounded.

A packaged transistor 10 may be mounted on a printed circuit board (not shown). An external output matching circuit (not shown) may also be mounted on the printed circuit board. A bias/RF diplexer (not shown) may be connected to the external output matching circuit to connect the transistor output to an RF output. Furthermore, a DC power supply (not shown) may be connected to the transistor's RF output lead 18.

Internal matching networks have been provided within RF power transistor packages, as illustrated in FIG. 1. However, such internal matching networks typically include a single capacitor. As explained above, including the capacitor within the device package can create a lower frequency feedback path between adjacent cells of a large periphery transistor die, which can reduce the stability of the overall device.

According to some embodiments of the invention, an internal matching network of a packaged RF transistor includes a plurality of parallel capacitors. Wirebond connections are provided from the plurality of the capacitors to respective cells of a multi-cell RF transistor die.

For example, an internal matching network can include a split capacitor and/or multiple capacitors on the base of the package adjacent the multi-cell RF transistor die. Providing an input matching network including a plurality of parallel capacitors can reduce and/or remove the low frequency feedback path(s), which can improve the stability of the packaged device.

Figure 2A:
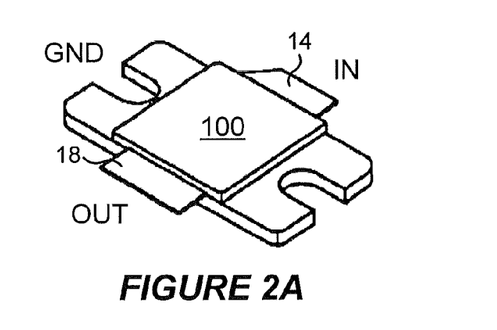
FIG. 2A is a perspective view of a packaged RF power transistor according to some embodiments of the invention.
Figure 2B:
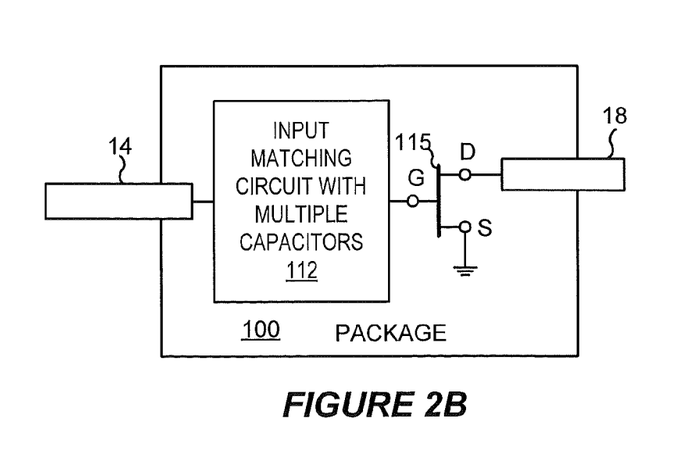
FIG. 2B is a functional block diagram of a packaged RF power transistor according to some embodiments of the invention.

A packaged RF transistor 100 according to some embodiments of the invention is shown generally in FIG. 2A and schematically in FIG. 2B. As shown therein, the packaged transistor 100 includes an RF input lead 14 and an RF output lead 18 that extend outside the package. The RF input lead 14 is connected through an input matching circuit 112 to a control terminal (such as the gate G) of a transistor 115, which can include a plurality of transistor cells connected in parallel. An output terminal (such as the drain D) of the transistor 115 is connected to the RF output lead 18. According to some embodiments, the input matching circuit includes multiple capacitors. Respective ones of the capacitors in the input matching circuit may be coupled to a respective transistor cell of the RF transistor 115.

Figure 3:
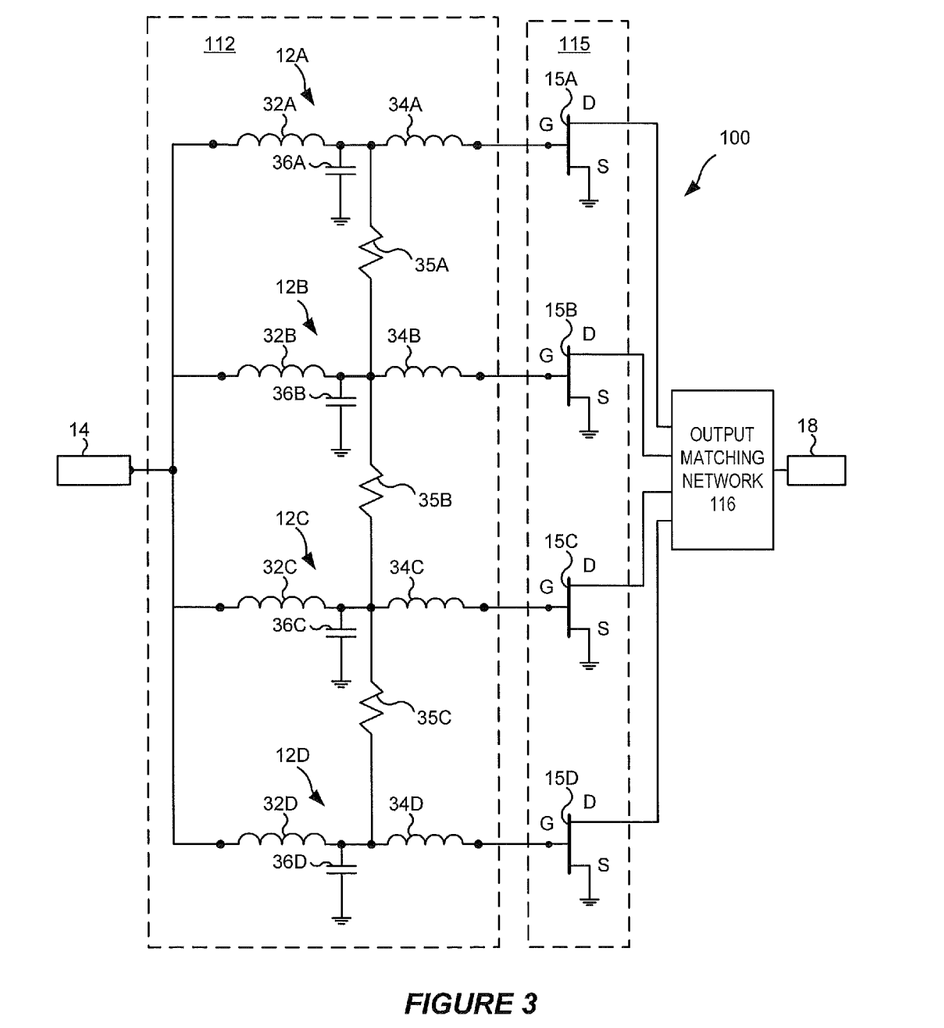
FIG. 3 is a schematic circuit diagram of a packaged RF power transistor according to some embodiments of the invention.
Figure 4:
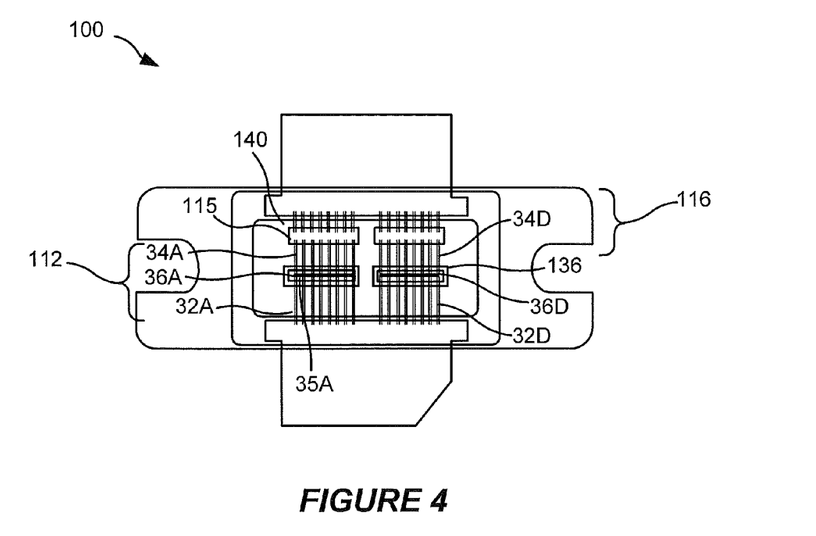
FIG. 4 is a plan view of a layout of a packaged RF power transistor according to some embodiments of the invention.

A schematic circuit diagram for a package 100 including an RF power transistor 115 and an input matching network 112 according to embodiments of the invention is illustrated in FIG. 3, and a physical layout of a package 100 according to embodiments of the invention is illustrated in FIG. 4. The RF power transistor 115 may comprise a single chip (die) or multiple chips (dice). Referring to FIGS. 3 and 4, a package 100 includes an RF transistor 115 including a plurality of parallel transistor cells 15A-D. Although FIG. 3 illustrates an RF transistor 115 including four parallel cells 15A, 15B, 15C and 15D, it will be appreciated that the RF transistor 115 can have more than four, or less than four, parallel cells, according to embodiments of the invention. Each of the transistor cells 15A-D includes a control or input terminal and an output terminal. For example, in embodiments including a FET device, each of the transistor cells includes a gate G, a drain D and a source S. In some embodiments, the gate G corresponds to the control or input terminal and the drain D corresponds to the output terminal, while the source S is grounded, as shown in FIG. 3.

An input matching network 112 is connected between an RF signal input lead 14 and gates G of the transistor cells 15A-D. The input matching circuit 112 may include a plurality of inductive wire bond connections including bond wires extending between the RF signal input lead 14 and a capacitor block 136, and inductive wire bond connections including bond wires extending from the capacitor block 136 to the gates of the transistors 15A-D.

The input matching network 112 includes a plurality of input matching circuits 12A to 12D, each of which is connected between the RF signal input lead 14 and a respective cell 15A-D of the RF transistor 115. Each of the input matching circuits 12A-D includes a first inductance 32A-D, a second inductance 34A-D and a capacitor 36A-D. As illustrated in FIG. 4, the first inductance 32A-D can be provided by a wire bond connection between the RF input lead 14 and a terminal of a corresponding capacitor 36A-D. The second inductance 34A-D can be provided by a wire bond connection between the terminal of the corresponding capacitor 36A-D and an input terminal of a corresponding cell 15A-D of the RF transistor 115.

A plurality of intra-capacitor resistors 35A to 35C are connected between input terminals of adjacent capacitors 36A-D of the input matching circuits 12A-D. The intra-capacitor resistors 35A to 35C may be provided, for example, as discrete surface mount resistors.

The presence of the intra-capacitor resistors 35A to 35C may provide impedance matching with enhanced stability. Packaged transistors incorporating large periphery die typically need internal matching to improve usable bandwidth. However, adding an input capacitor as an internal input matching capacitor to the device can create a low frequency feedback path between adjacent cells of the large die, which can place a stability burden on the device. The internal matching circuitry of a large periphery power transistor may be carefully selected to avoid creating odd mode oscillations. However, selection of appropriate capacitor values and/or bond wire lengths (inductors) may place undesirable constraints on the matching network topology.

By providing the input capacitor input as a plurality of individual capacitors with intra-capacitor resistors coupled between the individual capacitors, the low frequency feedback path may be removed or attenuated while maintaining the impedance matching benefits of the input capacitor. Accordingly, design freedom of the capacitance and inductance values in the input matching circuits 12A to 12D may be increased.

Figure 5:
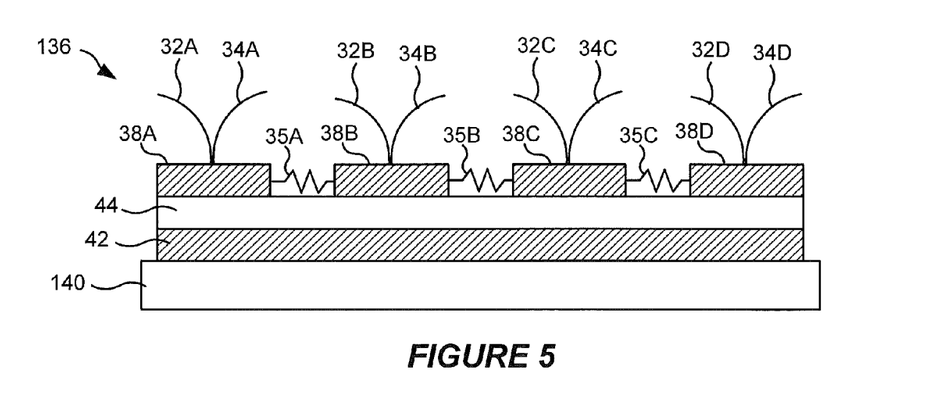
FIG. 5 is a cross sectional view of a split capacitor in accordance with some embodiments of the invention.

The capacitors 36A-D of the input matching network can be provided in a capacitor block 136 that can include discrete capacitor devices and/or can include a split capacitor, as illustrated in FIG. 5. Referring to FIG. 5, the capacitor block 136 can include a split capacitor including a plurality of discrete input terminals 38A to 38D provided on a common dielectric 44 and a common ground terminal 42 on the base 140, as illustrated in FIGS. 4 and 5. The wire bonds 32A-D connecting the RF input lead 14 to the input terminals 38A-D and the wire bonds 34A-D connecting the input terminals 38A-D to the input terminals of the respective transistor cells 15A-D are also partially illustrated in FIG. 5. A plurality of intra-capacitor resistors 35A to 35C are connected between input terminals 38A to 38D of adjacent capacitors 36A-D. The intra-capacitor resistors 35A to 35C may be provided, for example, as discrete surface mount resistors on the dielectric 44 between adjacent input terminals 38A to 38D.

In the embodiments illustrated in FIGS. 3 and 4, the output terminals of the transistor cells 15A to 15D are connected to the RF output lead 18 through an output matching network 116. The design of output matching networks is well known in the art, and need not be described in detail herein.

As shown in FIG. 4, the capacitor block 136 can be mounted on the base 140 of the package 100 adjacent to the transistor 15. It will be appreciated that the base of the package 100 can refer to any structural member on which the transistor 15 is mounted, and accordingly can correspond to a substrate, flange, die carrier, or the like.

Figure 6:
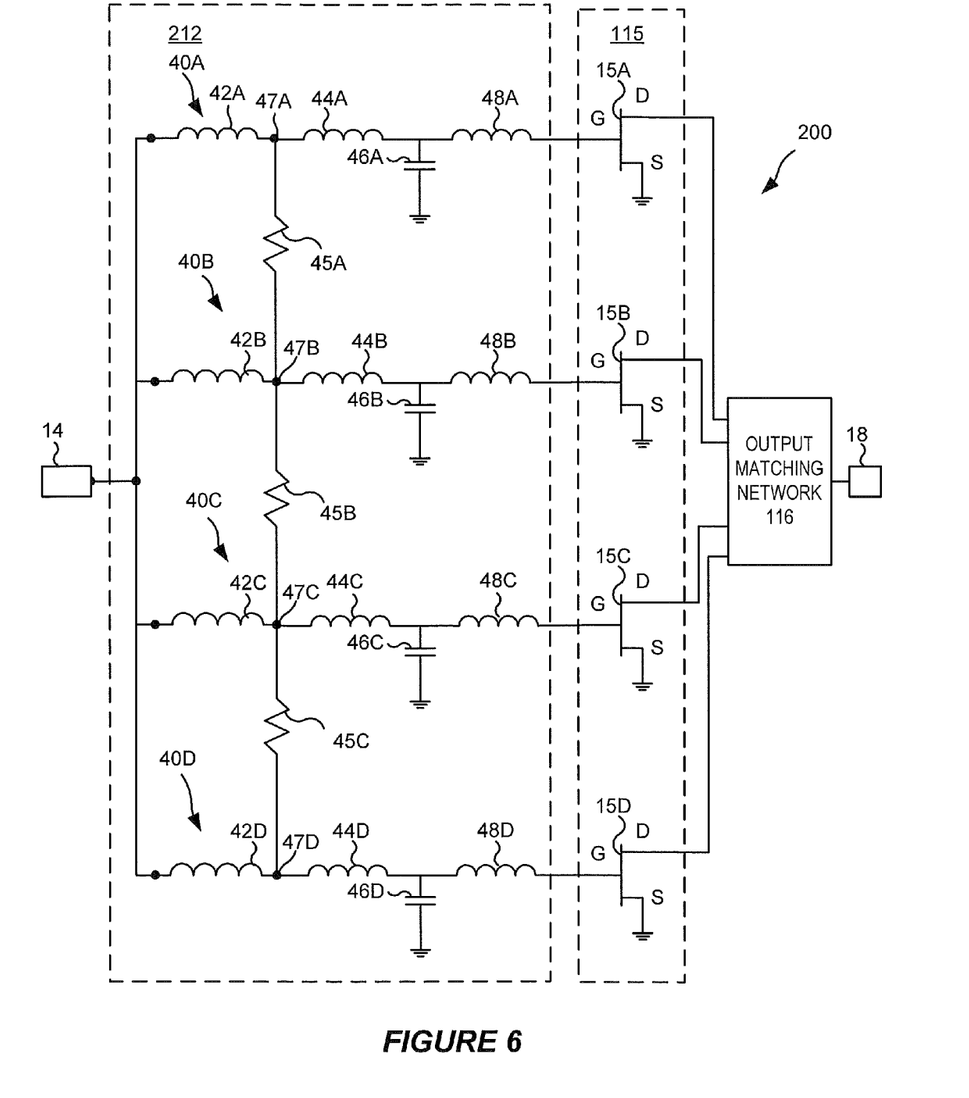
FIG. 6 is a schematic circuit diagram of a packaged RF power transistor according to further embodiments of the invention.
Figure 7A:
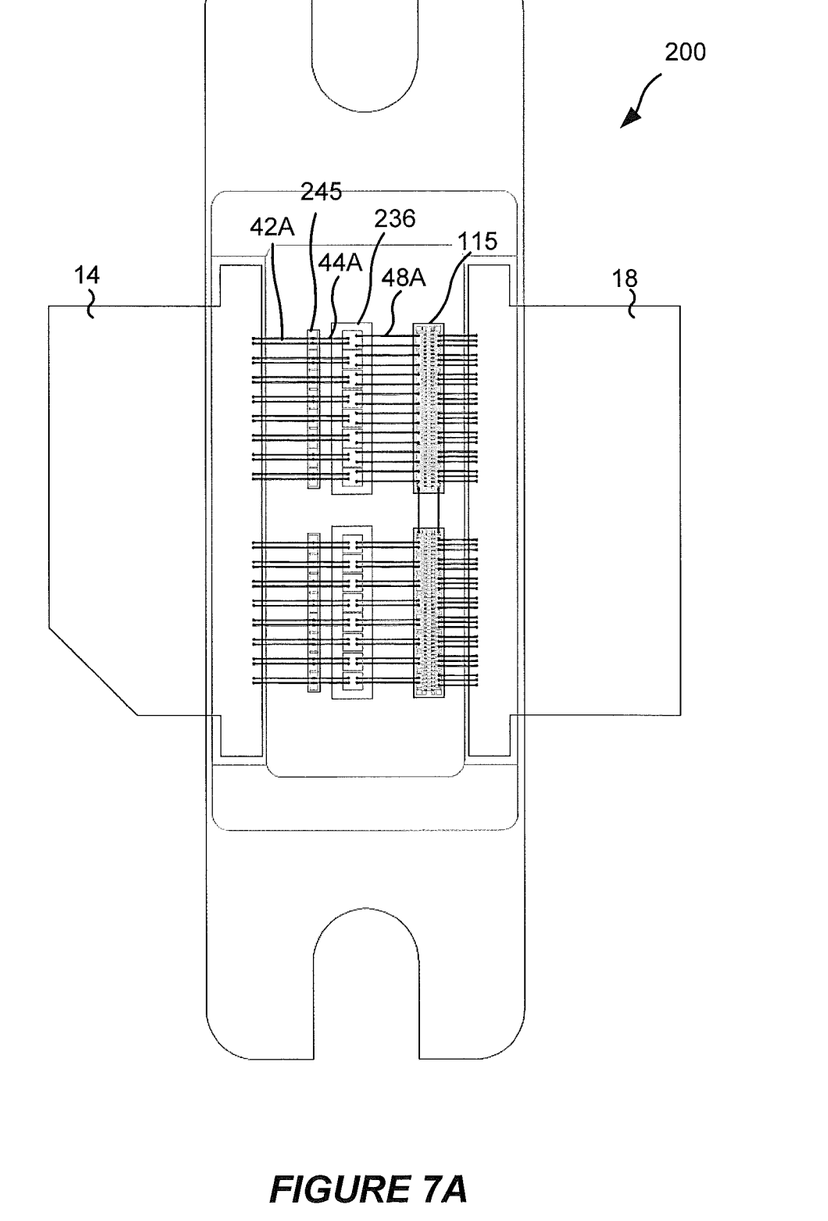
FIGS. 7A and 7B are a plan views of a layout of a packaged RF power transistor according to further embodiments of the invention.
Figure 7B:
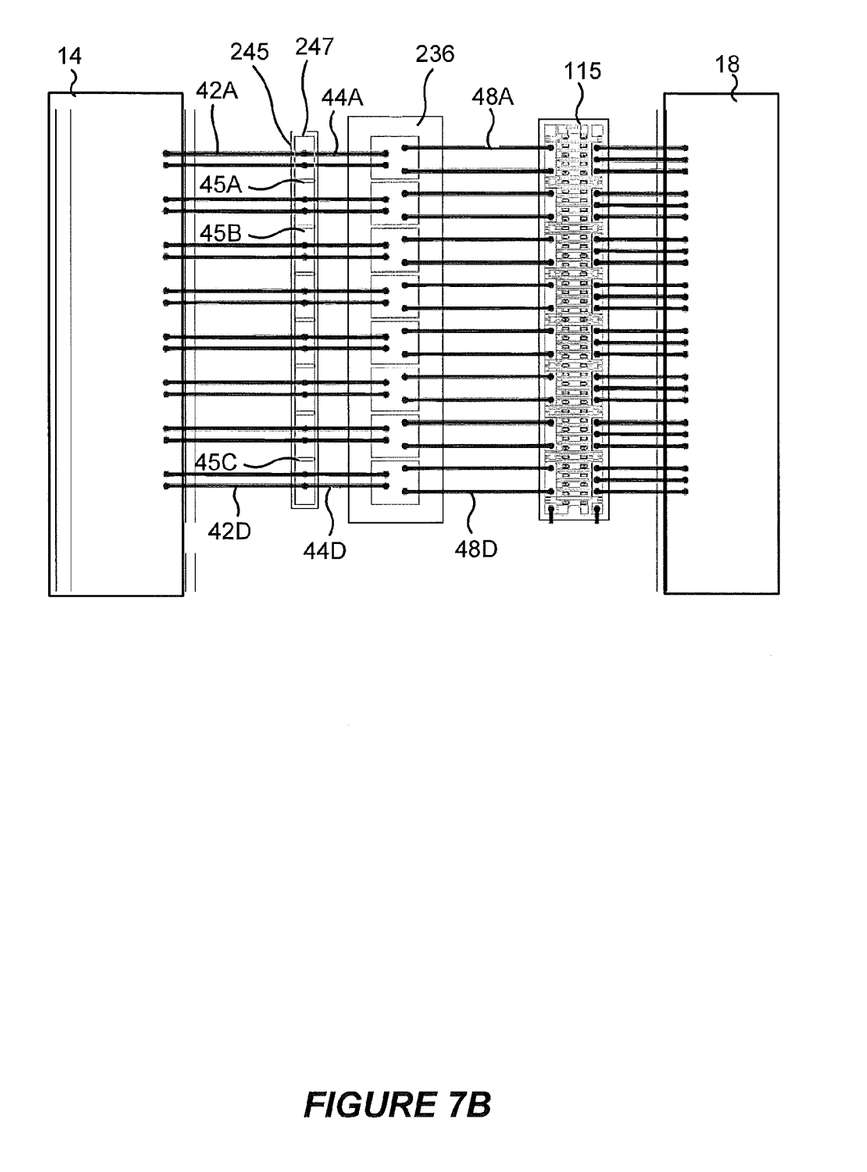

A schematic circuit diagram for a package 200 including an RF power transistor 115 and an input matching network 212 according to further embodiments of the invention is illustrated in FIG. 6, and a physical layout of a package 200 according to embodiments of the invention is illustrated in FIGS. 7A and 7B. FIG. 7B is a magnified view illustrating some features of the package layout of FIG. 7A in more detail.

Referring to FIGS. 6, 7A and 7B, the input matching network 212 is connected between the RF signal input lead 14 and gates G of the transistor cells 15A-D of a power transistor 115, and includes a plurality of input matching circuits 40A to 40D, each of which is connected between the RF signal input lead 14 and a respective cell 15A-D of the RF transistor 115. In the embodiments illustrated in FIGS. 6, 7A and 7B, a plurality of intra-capacitor resistors 45A-C are connected between input terminals of adjacent capacitors 46A-D of the input matching circuits 40A-D.

The intra-capacitor resistors 45A-C may be provided on a separate resistor block 245 that may be provided on the base of the package 200 between the RF signal input lead 14 and a split capacitor block 236. The resistor block 245 may include a ceramic substrate 247, such as an alumina substrate, on which a plurality of series connected resistors 45A to 45C are mounted. The intra-capacitor resistors 45A to 45C may be provided, for example, as discrete surface mount resistors on the ceramic substrate 247.

The resistor block 235 may include N number of nodes 47A to 47D, and N−1 number of resistors 45A to 45C may be coupled between respective pairs of the nodes 47A-D.

The input matching circuit 212 may include a plurality of inductive wire bond connections including first bond wires 42A-D extending between the RF signal input lead 14 and respective resistors 45A-D in the resistor block 245, inductive wire bond connections including second bond wires 44A-D extending from respective resistors 45A-D in the resistor block 245 to respective capacitors 46A-D in the capacitor block 236, and inductive wire bond connections including third bond wires 48A-D extending from respective capacitors 46A-D in the capacitor block 236 to respective gates of the transistors 15A-D.

Stated differently, each of the input matching circuits 40A-D includes a first inductance 42A-D, a second inductance 44A-D, a capacitor 46A-D and a third inductance 48A-D. As illustrated in FIG. 6, the first inductance 42A-D can be provided by a wire bond connection between the RF input lead 14 and a respective node 47A-D of the resistor block 245. The second inductance 44A-D can be provided by a wirebond connection between a respective node 47A-D of the resistor block 245 and a terminal of a corresponding capacitor 46A-D. The third inductance 48A-D can be provided by a wire bond connection between the terminal of the corresponding capacitor 46A-D and an input terminal of a corresponding cell 15A-D of the RF transistor 115.

Figure 8:
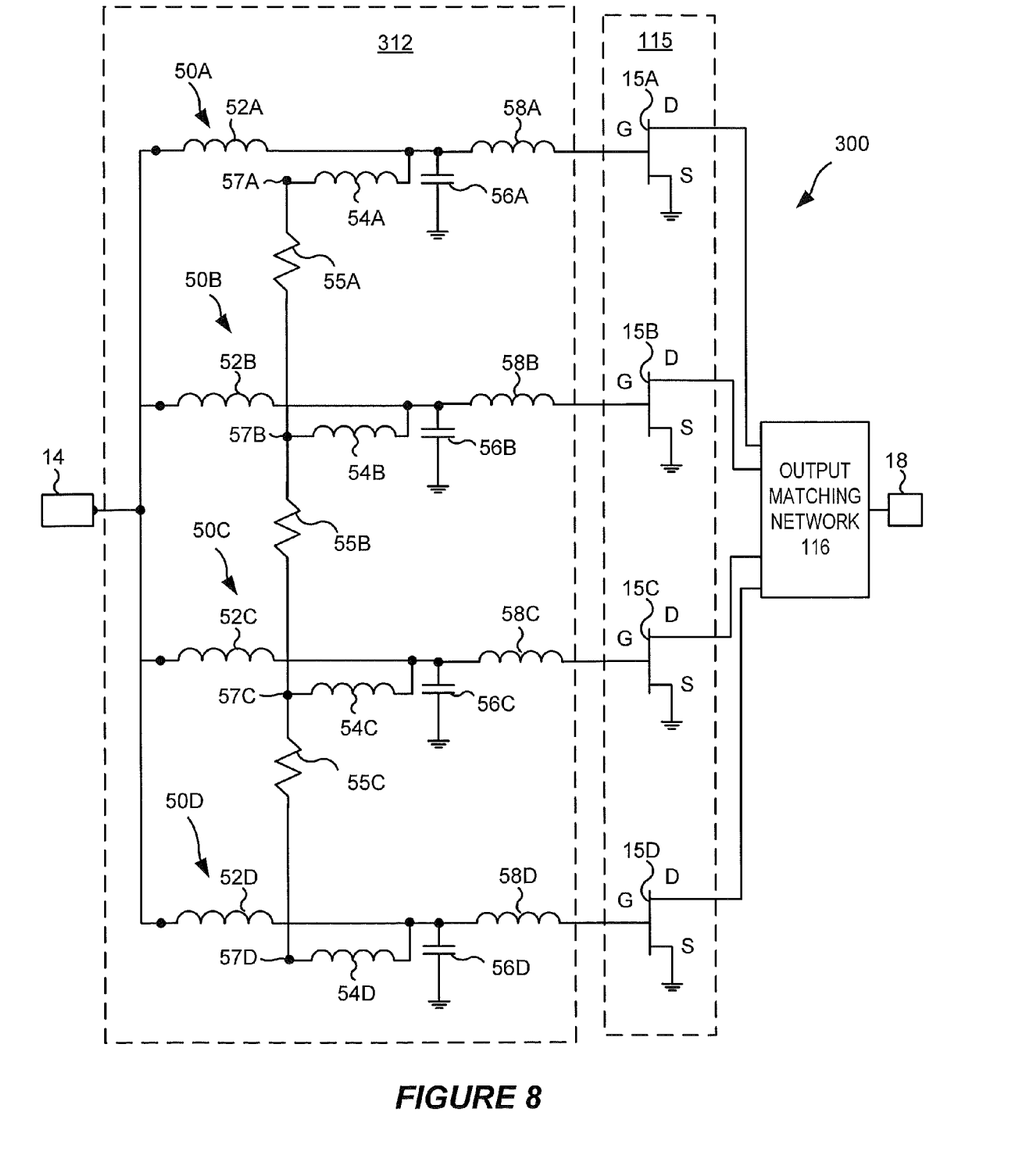
FIG. 8 is a schematic circuit diagram of a packaged RF power transistor according to further embodiments of the invention.
Figure 9A:
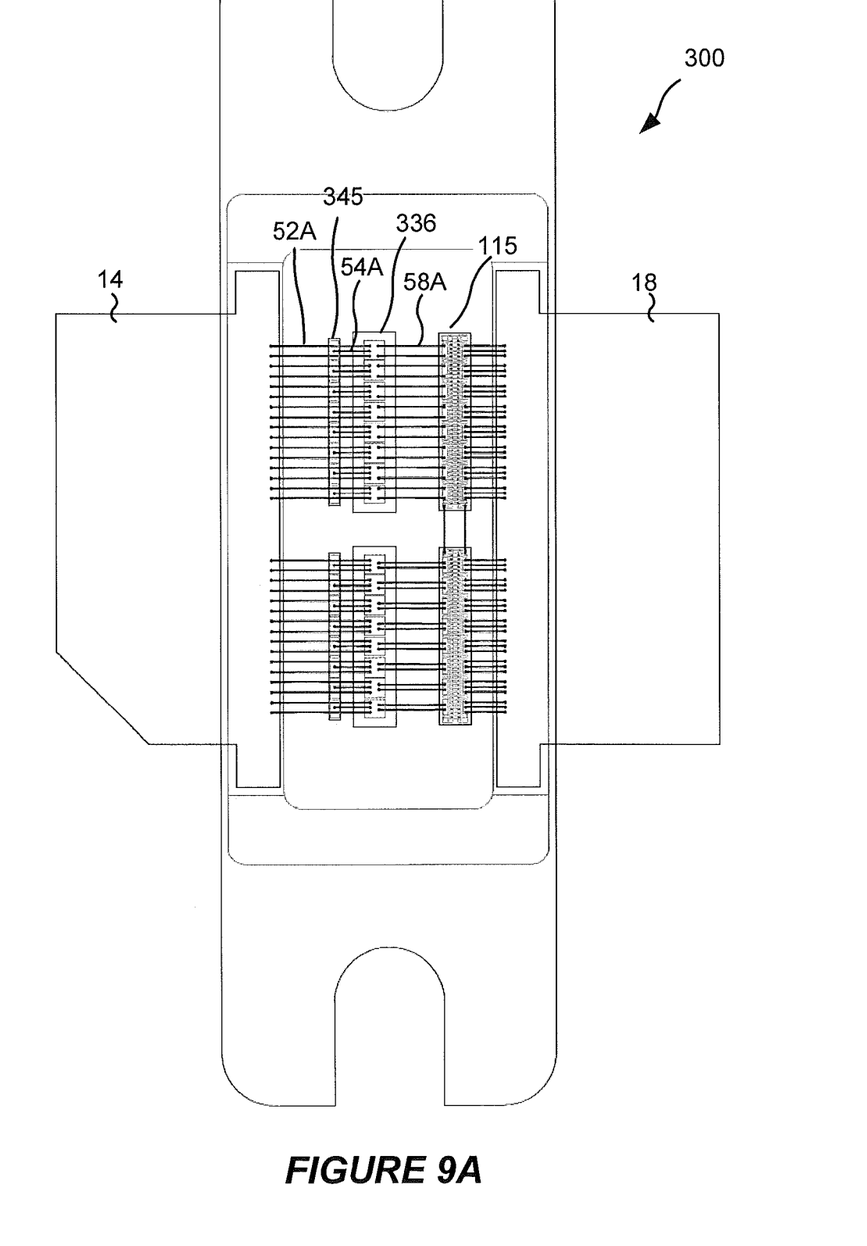
FIGS. 9A and 9B are a plan views of a layout of a packaged RF power transistor according to further embodiments of the invention.
Figure 9B:
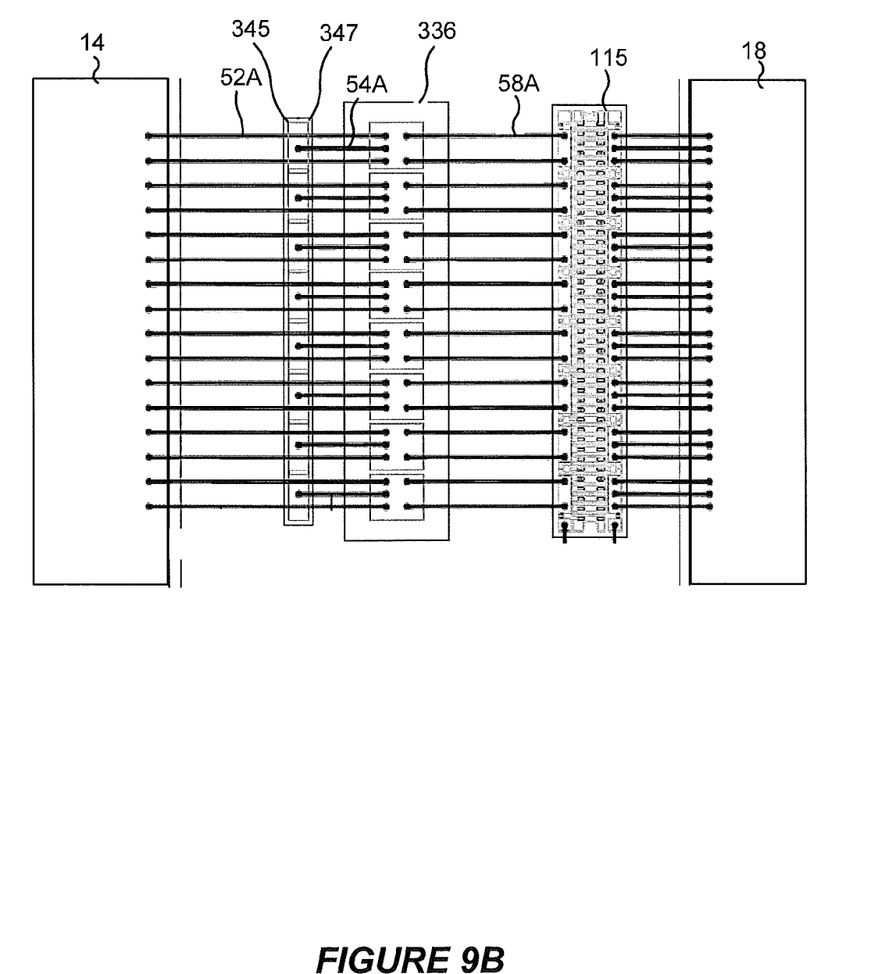

A schematic circuit diagram for a package 300 including an RF power transistor 115 and an input matching network 312 according to further embodiments of the invention is illustrated in FIG. 8, and a physical layout of a package 300 according to embodiments of the invention is illustrated in FIGS. 9A and 9B. FIG. 9B is a magnified view illustrating some features of the package layout of FIG. 9A in more detail.

Referring to FIGS. 8, 9A and 9B, the input matching network 312 is connected between the RF signal input lead 14 and gates G of the transistor cells 15A-D of a power transistor 115, and includes a plurality of input matching circuits 50A to 50D, each of which is connected between the RF signal input lead 14 and a respective cell 15A-D of the RF transistor 115. In the embodiments illustrated in FIGS. 8, 9A and 9B, a plurality of intra-capacitor resistors 55A-C are connected between input terminals of adjacent capacitors 56A-D of the input matching circuits 50A-D.

The intra-capacitor resistors 55A-C may be provided on a separate resistor block 345 that may be provided on the base of the package 300 between the RF signal input lead 14 and a split capacitor block 336. The resistor block 345 may include a ceramic substrate 347, such as an alumina substrate, on which a plurality of series connected resistors 55A to 55C are mounted. The intra-capacitor resistors 55A to 55C may be provided, for example, as discrete surface mount resistors on the ceramic substrate 347.

The resistor block 335 may include N number of nodes 57A to 57D, and N−1 number of resistors 55A to 55C may be coupled between respective pairs of the nodes 57A-D.

The input matching circuit 312 may include a plurality of inductive wire bond connections including first bond wires 52A-D extending between the RF signal input lead 14 and respective capacitors 56A-D in the capacitor block 336, inductive wire bond connections including second bond wires 54A-D extending from respective capacitors 56A-D in the capacitor block 336 to respective ones of the resistors 55A-D, and inductive wire bond connections including third bond wires 58A-D extending from respective capacitors 56A-D in the capacitor block 336 to respective gates of the transistors 15A-D.

Stated differently, each of the input matching circuits 50A-D includes a first inductance 52A-D, a second inductance 54A-D, a capacitor 56A-D and a third inductance 58A-D. As illustrated in FIG. 8, the first inductance 52A-D can be provided by a wire bond connection between the RF input lead 14 and a respective capacitor 56A-D of the capacitor block 3336. The second inductance 54A-D can be provided by a wirebond connection between a respective node 57A-D of the resistor block 345 and a terminal of a corresponding capacitor 56A-D. The third inductance 58A-D can be provided by a wire bond connection between the terminal of the corresponding capacitor 56A-D and a gate terminal of a corresponding cell 15A-D of the RF transistor 115.

While embodiments of the present application have been described primarily in connection with an input matching circuit, embodiments of the invention may be used in an output matching circuit, such as the output matching circuit 116 illustrated in FIGS. 3, 4, 6 and 8. For example, a capacitor block 136 including a split capacitor as shown in FIG. 5 could be provided in the output matching circuit 116 according to some embodiments. In such embodiments, an output terminal (e.g., the drain D) of each of the transistor cells 15A-D may be coupled to a corresponding input terminal 38A-D of a capacitor of the capacitor block 136, for example via an inductive bond wire. The input terminals 38A-D may likewise be coupled to the RF output lead 18, for example via an inductive bond wire. The lengths of the inductive bond wires and the capacitance of the capacitors in the capacitor block 136 may be chosen to provide a suitable impedance match at the output of the transistor die 115.

Furthermore, while embodiments of the present application have been described primarily in connection with packaged RF transistors including a single transistor die, multiple transistor dice 115 could be included in a single package 100, with a capacitor block including multiple capacitors provided for one or more of the transistor dice, according to some embodiments of the invention.

A packaged RF power transistor according to embodiments of the invention may be useful in a wide range of applications in which stability is important. For example, a packaged power transistor according to embodiments of the invention may have application in systems, such as WiMAX, WCDMA, CDMA, and/or other systems, including future (4th generation) systems. In general, embodiments of the invention may be useful in any application in which stable operation is desired from a power transistor.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged RF transistor device, comprising:
   an RF transistor die including a plurality of RF transistor cells, each of the plurality of RF transistor cells including a control terminal and an output terminal;
   an RF input lead; and
   an input matching network coupled between the RF input lead and the RF transistor die, the input matching network including a plurality of discrete capacitors having respective input terminals, wherein the input terminals of the discrete capacitors are coupled to the control terminals of respective ones of the RF transistor cells, and wherein the input matching network further comprises a plurality of resistors coupled respectively between adjacent input terminals of the discrete capacitors.

2. The packaged RF transistor device of claim 1, wherein the input matching network further comprises first wire bonds between the RF input lead and the input terminals of respective ones of the discrete capacitors, and second wire bonds between the input terminals of respective ones of the discrete capacitors and the control terminals of respective ones of the RF transistor cells.

3. The packaged RF transistor device of claim 2, wherein the input matching network further comprises third wirebonds between the input terminals of the discrete capacitors and respective terminals of the resistors.

4. The packaged RF transistor device of claim 3, wherein the plurality of resistors is provided as a resistor block between the RF input lead and the RF transistor die, and wherein the resistor block comprises a plurality of nodes between respective ones of the resistors, the resistors are connected in electrical series, and the third wirebonds are coupled between respective ones of the nodes and the input terminals of the discrete capacitors.

5. The packaged RF transistor device of claim 1, wherein the input network further comprises first wire bonds between the RF input lead and terminals of the respective resistors, second wirebonds between the terminals of the resistors and the input terminals of respective ones of the capacitors, and third wire bonds between the input terminals of respective ones of the capacitors and the control terminals of respective ones of the RF transistor cells.

6. The packaged RF transistor device of claim 1, further comprising a base, wherein the RF transistor die is mounted on the base between the RF input lead and an RF output lead, and wherein the plurality of resistors is provided as a resistor block on the base between the RF input lead and the RF transistor die.

7. The packaged RF transistor device of claim 6, wherein the plurality of discrete capacitors is provided as a capacitor block on the base between the resistor block and the RF transistor die.

8. The packaged RF transistor device of claim 6, wherein the resistor block comprises a plurality of nodes between respective ones of the resistors, the resistors are connected in electrical series, and the second wirebonds are coupled between respective ones of the nodes and the input terminals of the capacitors.

9. The packaged RF transistor device of claim 1, further comprising:
an RF output lead coupled to the output terminals of respective ones of the RF transistor cells;
a base, wherein the RF transistor die is mounted on the base between the RF input lead and the RF output lead, wherein the plurality of discrete capacitors is provided as a capacitor block on the base between the RF input lead and the RF transistor die and wherein the plurality of resistors is provided as a resistor block on the base between the RF input lead and the capacitor block; and
a package that houses the RF transistor die and the input matching network, with the RF signal input lead and the RF signal output lead extending from the package.

10. The packaged RF transistor device of claim 1, wherein the plurality of resistors comprises a plurality of discrete devices.

11. The method of claim 1, wherein each RF transistor cell is connected to a different one of the plurality of discrete capacitors.

12. A packaged RF transistor device, comprising:
an RF transistor die including a plurality of RF transistor cells, each of the plurality of RF transistor cells including a control terminal and an output terminal;
an RF input lead; and
an input matching network coupled between the RF input lead and the RF transistor die, the input matching network including a split capacitor including a plurality of input terminals, wherein the input terminals of the split capacitor are coupled to the control terminals of respective ones of the RF transistor cells and wherein the input matching network further comprises a plurality of resistors coupled respectively between adjacent input terminals of the split capacitor.

13. The packaged RF transistor device of claim 12, wherein the input matching network further comprises first wire bonds between the RF input lead and respective input terminals of the split capacitor, and second wire bonds between the respective input terminals of the split capacitor and the control terminals of respective ones of the RF transistor cells.

14. A method of forming a packaged RF transistor device, comprising:
mounting a transistor on a base, the transistor including a plurality of RF transistor cells, each of the plurality of RF transistor cells including a control terminal and an output terminal;
mounting a plurality of discrete capacitors having respective input terminals on the base;
coupling the input terminals of the discrete capacitors to the control terminals of respective ones of the RF transistor cells;
coupling a plurality of resistors between adjacent input terminals of the discrete capacitors; and
coupling an RF input lead to the input terminals of the discrete capacitors.

15. The method of claim 14, further comprising:
forming a package housing on the base, the housing enclosing the transistor and the plurality of discrete capacitors, with the RF input lead extending from the package.

16. The method of claim 14, further comprising:
wherein coupling the RF input lead to the input terminals of the discrete capacitors comprises forming first wire bonds between the RF input lead and the input terminals of respective ones of the discrete capacitors, and wherein coupling the input terminals of the discrete capacitors to the control terminals of respective ones of the RF transistor cells comprises forming second wirebonds between the input terminals of respective ones of the discrete capacitors and the control terminals of respective ones of the RF transistor cells.

17. The method of claim 16, further comprising forming third wirebonds between the input terminals of the discrete capacitors and respective terminals of the resistors.

18. The method of claim 14, further comprising:
coupling an RF output lead to the output terminals of respective ones of the RF transistor cells; and
forming a package housing that houses the RF transistor die and the plurality of discrete capacitors, with the RF input lead and the RF output lead extending from the package.

19. The method of claim 18, further comprising mounting the RF transistor die on the base between the RF input lead and the RF output lead, and wherein mounting the plurality of discrete capacitors comprises mounting a capacitor block on the base between the RF input lead and the RF transistor die.

20. The method of claim 19, wherein the plurality of resistors is provided as a resistor block between the RF input lead and the RF transistor die, and wherein the resistor block comprises a plurality of nodes between respective ones of the resistors, the resistors are connected in electrical series, and third wirebonds are coupled between respective ones of the nodes and the input terminals of the discrete capacitors.

21. The method of claim 14, wherein the input matching network further comprises first wire bonds between the RF input lead and terminals of the respective resistors, second wirebonds between the terminals of the resistors and the input terminals of respective ones of the discrete capacitors, and third wirebonds between the input terminals of respective ones of the discrete capacitors and the control terminals of respective ones of the RF transistor cells.

22. The method of claim 14, further comprising providing a base and mounting the RF transistor die on the base between the RF input lead and an RF output lead, and wherein the plurality of resistors is provided as a resistor block on the base between the RF input lead and the RF transistor die.

23. The method of claim 22, wherein the plurality of discrete capacitors is provided as a capacitor block on the base between the resistor block and the RF transistor die.

* * * * *